(12) United States Patent
Hosoda

(10) Patent No.: US 9,130,506 B2
(45) Date of Patent: *Sep. 8, 2015

(54) PIEZOELECTRIC OSCILLATOR

(71) Applicant: Nihon Dempa Kogyo Co., Ltd., Tokyo (JP)

(72) Inventor: Tomoyuki Hosoda, Sayama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/094,901

(22) Filed: Dec. 3, 2013

(65) Prior Publication Data

US 2014/0104011 A1  Apr. 17, 2014

Related U.S. Application Data

(62) Division of application No. 13/363,631, filed on Feb. 1, 2012, now Pat. No. 8,669,821.

(30) Foreign Application Priority Data

Feb. 4, 2011 (JP) ................................. 2011-022346
Dec. 14, 2011 (JP) ................................. 2011-273840

(51) Int. Cl.
*H03B 5/36* (2006.01)

(52) U.S. Cl.
CPC ................ *H03B 5/362* (2013.01); *H03B 5/364* (2013.01)

(58) Field of Classification Search
CPC .......... H03B 5/36; H03B 5/362; H03B 5/364; H03B 5/366; H03B 5/32; H03B 7/00; H03B 2202/05
USPC ............ 331/116 R, 116 FE, 158, 162, 117 R, 331/117 FE
See application file for complete search history.

(56) References Cited

U.S. PATENT DOCUMENTS 4,553,110 A  11/1985 Kleinberg
4,599,582 A  * 7/1986 Lewis et al. ............... 331/117 D
(Continued)

FOREIGN PATENT DOCUMENTS

JP   H01-074616   5/1989
JP   10-112612    4/1998
(Continued)

OTHER PUBLICATIONS

International Standard, Waveguid type dielectric resonators Part 2: Guidelines for oscillator and filter applications, IEC 61338-2, First edition May 2004, International Electrotechnical Commission.
The Institute of Electronics, Inforomation and Communication Engineers, "Knowledge Base," 9-7-5 (ver. 1/2010.7.22), Active Circuit Element 5-1-4 General Configuration of FET Oscillator.

*Primary Examiner* — Ryan Johnson
(74) *Attorney, Agent, or Firm* — Jacobson Holman, PLLC.

(57) ABSTRACT

Provided is a piezoelectric oscillator to attain high-frequency performance and frequency stabilization with the use of reflection characteristics of a reflective element. A piezoelectric oscillator is configured such that a resonant circuit is connected to a gate of a field effect transistor; an output terminal is connected to a drain and a power supply voltage V is applied to the drain; a piezoelectric resonator is connected to a source, as a reflective element; and a resonance frequency of the resonant circuit and an oscillation frequency of the piezoelectric resonator as a reflective element are set to substantially the same frequency, and further, the piezoelectric oscillator may be configured such that a first matching circuit is provided between the resonant circuit and the gate, second matching circuit is provided between the drain and the output terminal, and a third matching circuit is provided between the source and the reflective element.

8 Claims, 8 Drawing Sheets

(56) References Cited

U.S. PATENT DOCUMENTS

| | | |
|---|---|---|
| 4,600,900 A | 7/1986 | Renoult |
| 4,873,498 A | 10/1989 | Kleinberg |
| 6,239,664 B1 | 5/2001 | Northam |
| 6,294,964 B1 | 9/2001 | Satoh |
| 6,549,083 B2 | 4/2003 | Kanazawa |
| 7,088,194 B2 * | 8/2006 | Matsuzuka ............... 331/117 D |
| 7,248,127 B2 | 7/2007 | Ishikawa |
| 7,369,005 B2 | 5/2008 | Kasahara |
| 7,642,871 B2 | 1/2010 | Yajima |
| 7,692,505 B2 | 4/2010 | Hashimoto |
| 8,031,018 B2 | 10/2011 | Kahmen |
| 8,669,821 B2 * | 3/2014 | Hosoda ................... 331/116 FE |
| 2008/0048764 A1 * | 2/2008 | Tokumitsu et al. .......... 327/535 |
| 2012/0081187 A1 | 4/2012 | Koyama |

FOREIGN PATENT DOCUMENTS

| | | |
|---|---|---|
| JP | 2000-082922 | 3/2000 |
| JP | 2000-295037 | 10/2000 |
| JP | 2008-157751 | 7/2008 |

* cited by examiner

PIEZOELECTRIC OSCILLATOR

This application is a Divisional Application of U.S. patent application Ser. No. 13/363,631, filed Feb. 1, 2012, which claims priority to Japanese Patent Application no, 2011-022346 filed Feb. 4, 2011, and Japanese Patent Application no, 2011-273840 filed Dec. 14, 2011, hereby incorporated by reference.

BACKGROUND OF THE INVENTION

1. Field of the Invention

The present invention relates to a piezoelectric oscillator using a reflective element, and, more specifically, to a piezoelectric oscillator which attains high-frequency performance and frequency stabilization with the use of reflection characteristics of a reflective element.

2. Description of the Related Art

[Prior Art]

As a piezoelectric oscillator, there are a Colpitts circuit, a Pierce circuit, and the like circuits.

A conventional oscillator has controlled its frequency by use of a circuit which oscillates by controlling the phase of a resonator.

As to the conventional piezoelectric oscillator, the folly wing describes a crystal oscillator circuit of the Colpitts circuit and a crystal oscillator circuit of an inverter circuit.

[Colpitts Crystal Oscillator Circuit: FIG. 13]

A conventional Colpitts crystal oscillator circuit is described with reference to FIG. 13. FIG. 13 is a circuit diagram for a conventional Colpitts crystal oscillator circuit.

The conventional Colpitts crystal oscillator circuit is configured, as illustrated in FIG. 13, such that: one end of a crystal oscillator X is connected to a base of a transistor Tr for oscillation, and another end of the crystal oscillator X is grounded.

Further, a power supply voltage V is applied to a collector of the transistor Tr via a resistor $R_c$, and an output terminal (OUTPUT) is provided via a capacitor.

Furthermore, an emitter of the transistor Tr is grounded via a resistor $R_E$.

The power supply voltage V is applied to the base of the transistor Tr via a resistor $R_A$, and the base is grounded via a resistor $R_B$.

Further, one end of a series connection of capacitors $C_1$ and $C_2$ is connected to the base, another end thereof is grounded, and a node between the capacitor $C_1$ and the capacitor $C_2$ ins connected to the emitter.

Oscillation operation is performed in the conventional Colpitta crystal oscillator circuit configured as such.

[Inverter Crystal Oscillation Circuit: FIG. 14]

A conventional inverter crystal oscillation circuit is described with reference to FIG. 14. FIG. 14 is a circuit diagram for a conventional inverter crystal oscillation circuit.

The conventional inverter crystal oscillation circuit is configured, as illustrated in FIG. 14, such that one end of a crystal oscillator X is connected to an input side of an inverter IC, another end of the crystal oscillator X is connected to an output side of the inverter IC, and further, the input side and the output side are connected to each other via a resistor $R_F$.

One end of a capacitor $C_g$ is connected to the input side, another end thereof is grounded, one end of a capacitor $C_d$ is connected to the output side, another end thereof is grounded, and an output terminal (OUTPUT) is provided on the output side.

Oscillation operation is performed in the conventional inverter crystal oscillation circuit configured as such.

[Related Art]

Note that, as related conventional techniques, there are Japanese Patent Application Laid-Open. No. 2000-082922, "Piezoelectric Oscillator" (Toyo Communication Equipment Co., Ltd.) [Patent Document 1]; Japanese Patent Application Laid-Open No. 2000-295037, "Highly-stable Piezoelectric Oscillator" (Toyo Communication Equipment Co., Ltd.) [Patent Document 2]; Japanese Utility Model Laid-Open No. 01-074616, "Microwave Oscillator Circuit" (Fuji Electrochemical Co., Ltd.) [Patent Document 3]; Japanese Patent Application Laid-Open No. 10-112612, "High-frequency Oscillator Circuit" (Murata Manufacturing Co., Ltd.) [Patent Document 4]; and Japanese Patent Application Laid-Open No. 2008-157751, "Sensing Device" (Nihon Dempa Kogyo Co., Ltd.) [Patent Document 5].

Further as Non-Patent Documents, there are "INTERNATIONAL STANDARD, Waveguide type dielectric resonators Part 2: Guidelines for oscillator and filter applications, IEC 61338-2, First edition 2004-05, International Electrotechnical Commission" [Non-Patent Document 1], and "the Institute of Electronics, Information and Communication Engineers, "Knowledge Base," 9-7-5 (ver. 1/2010.7.22), Active Circuit Element 5-1-4 General Configuration of FET Oscillator" [Non-Patent Document 2].

Patent Documents 1 and 2 disclose that in a piezoelectric oscillator, a series resonant circuit is connected to a base of a transistor, and a parallel resonant circuit is connected between the base and an emitter.

Patent Document 3 discloses that in a microwave oscillator circuit, a feedback section using a dielectric body and an amplifier are used in combination and a reflecting section for reflecting a fundamental wave is provided on an output side of the amplifier, so that the fundamental wave is returned to the feedback section so as to output a high frequency.

Patent Document 4 discloses that in a high-frequency oscillator circuit, oscillation conditions are set in an output filter.

Further, Patent Document 5 discloses a sensing device which includes an oscillator circuit for supplying a piezoelectric vibrator with oscillation drive electricity so that driving current is 0.3 mA or less, in order to oscillate the piezoelectric vibrator.

Further, Non-Patent Document 1 discloses an example of a reflecting oscillator.

Moreover, Non-Patent Document 2 discloses a general configuration of an oscillator circuit using an FET transistor.

[Patent Document 1] Japanese Patent Application Laid-Open No. 2000-082922

[Patent Document 2] Japanese Patent Application Laid-Open No. 2000-295037

[Patent Document 3] Japanese Utility Model Laid-Open No. 01-074616

[Patent Document 4] Japanese Patent Application Laid-Open No. 10-112612

[Patent Document 5] Japanese Patent Application Laid-Open No. 2008-157751

[Non-Patent Document 1] INTERNATIONAL STANDARD, Waveguide type dielectric resonators Part 2: Guidelines for oscillator and filter applications, IEC 61338-2, First edition 2004-05, International Electrotechnical Commission.

[Non-Patent Document 2] The Institute of Electronics, Information and Communication Engineers, "Knowledge Base," 9-7-5(ver. 1/2010.7.22), Active Circuit Element 5-1-4 General Configuration of FET Oscillator However, the conventional piezoelectric oscillator has the following problems: as the frequency becomes higher, its wavelength becomes shorter, and for this, it is necessary to take into consideration the line length of a printed-circuit board, the line length from a resonator to a package, misalignment at the time of mounting a resonator, and the like; and moreover, the line lengths are changed due to those factors, which causes the frequency to deviate from a desired frequency and makes phase adjustment sensitive due to adjustment of the frequency, thereby making it difficult to highly stabilize the frequency.

SUMMARY OF THE INVENTION

The present invention is accomplished in view of the above facts, and an object of the present invention is to provide a piezoelectric oscillator which can attain high-frequency performance and early stabilization of the frequency with the use of reflection characteristics of a reflective element.

The present invention to solve the problems of the conventional examples is a piezoelectric oscillator including a transistor, wherein: a resonant circuit connected to a gate of the transistor; an output terminal is provided for a drain of the transistor and a power supply voltage ins applied to the drain; a reflective element for causing reflection by resonance is connected to a source of the transistor; and an oscillation frequency of the reflective element and a resonance frequency of the resonant circuit are set to substantially the same frequency. Accordingly, the present invention has an effect to stabilize the frequency at a high frequency at an early stage.

The present invention is a piezoelectric oscillator including a transistor, wherein: a resonant circuit is connected to a gate of the transistor via a first matching circuit; an output terminal is provided for a drain of the transistor via a second matching circuit and a power supply voltage is applied to the drain; a reflective element for causing reflection by resonance is connected to a source of the transistor via a third matching circuit; and a resonance frequency of the resonant circuit is made variable by the first matching circuit, the second matching circuit, and the third matching circuit, thereby setting the resonant frequency thus made variable and an oscillation frequency of the reflective element to substantially the same frequency. Accordingly, the present invention has an effect to stabilize the frequency at a high frequency at an early stage.

The present invention is a piezoelectric oscillator including a transistor, wherein: a resonant circuit is connected to a gate of the transistor; a power supply voltage is applied to a drain of the transistor; a reflective element for causing reflection by resonance is connected to a source of the transistor and an output terminal is provided for the source; and an oscillation frequency of the reflective element and a resonance frequency of the resonant circuit are set to substantially the same frequency. Accordingly, the present invention has an effect to stabilize the frequency at a high frequency at an early stage.

The present invention a piezoelectric oscillator including a transistor, wherein: a resonant circuit is connected to a gate of the transistor via a first matching circuit; a power supply voltage is applied to a drain of the transistor via a second matching circuit; a reflective element for causing reflection by resonance is connected to a source of the transistor via a third matching circuit and an output terminal is provided for the source; and a resonance frequency of the resonant circuit is made variable by the first matching circuit, the second matching circuit, and the third matching circuit, thereby setting the resonant frequency thus made variable and an oscillation frequency of the reflective element to substantially the same frequency. Accordingly, the present invention has an effect to stabilize the frequency at a high frequency at an early stage.

In the present invention, the piezoelectric oscillator is configured such that the reflective element is a piezoelectric resonator.

In the present invention, the piezoelectric oscillator is configured such that the resonant circuit is constituted by a parallel connection circuit of a coil and a capacitor.

In the present invention, the piezoelectric oscillator is configured such that the resonant circuit is a piezoelectric resonator.

In the present invention, the piezoelectric oscillator is configured such that: the reflective element and the resonant circuit are piezoelectric resonators; and the piezoelectric resonator as the reflective element and the piezoelectric resonator as the resonant circuit are constituted by resonators configured such that two electrodes are formed in a single piezoelectric element and the two electrodes are assumed as respective electrodes of the two piezoelectric resonators.

In the present invention, the piezoelectric oscillator is configured such that: the matching circuits each have a variable capacitance element and a variable resistor; and an unbalanced state is created by changing settings of the variable capacitance elements or/and the variable resistors so as to make a frequency variable by use of returning to a balanced state. Accordingly, the present invention has an effect to make the oscillation frequency variable and stabilize the frequency thus made variable at an early stage.

In the present invention, the piezoelectric oscillator is configured such that the resonant circuit is constituted by a microstripline and a resonator.

In the present invention, the piezoelectric oscillator is configured such that a filter is provided so as to be followed by the output terminal.

In the present invention, the piezoelectric oscillator is configured such that the transistor is a field effect transistor.

In the present invention, the piezoelectric oscillator is configured such that the transistor is an NPN transistor.

DESCRIPTION OF REFERENCE NUMERALS

1 ... Transistor, 2 ... Matching Circuit (M), 3 ... Resonant Circuit, 4 ... Resistor ($Z_0$), 5 ... Matching Circuit (M), 6 ... Piezoelectric Resonator, 7 ... Matching Circuit (M), 8, 8' ... Output Terminal, 9, 9' ... Filter, 10 ... Resistor ($R_1$), 11 ... Matching Circuit (M), 12 ... Feedback Reactance, 13 ... Coil ($L_2$), 14 ... Resistor ($R_2$), 30 ... Piezoelectric Resonator, 31 ... Coil ($L_1$), 32 ... Capacitor ($C_1$), 33 ... Microstripline, 34 ... Resonator Description of the Preferred Embodiment Embodiments of the present invention are described with reference to drawings.

[Summary of Preferred Embodiments]

A piezoelectric oscillator according to an embodiment of the present invention is a piezoelectric oscillator in which: a resonant circuit is connected to a gate (a base) of a transistor, an output terminal is connected to a drain (a collector) of the transistor, a power supply voltage is applied to an output terminal side, a reflective element is connected to a source (an emitter) of the transistor, and a resonance frequency of the resonant circuit and an oscillation frequency of the reflective element are set to substantially the same frequency. Thus, the piezoelectric oscillator can stabilize its frequency at a high frequency at an early stage.

Further, a piezoelectric oscillator according to an embodiment of the present invention is a piezoelectric oscillator in which: a resonant circuit is connected to a gate (a base) of a transistor, a power supply voltage is applied to a drain (a collector) of the transistor, a reflective element and an output terminal are connected to a source (an emitter) of the transistor, and a resonance frequency of the resonant circuit and an oscillation frequency of the reflective element are set to substantially the same frequency. Thus, the piezoelectric oscillator can stabilize its frequency at a high frequency at an early stage.

Figure 1:
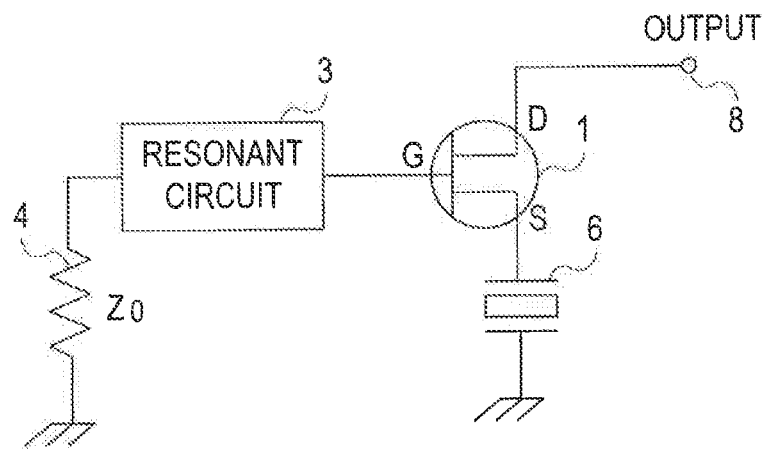
FIG. 1 is a circuit diagram for a piezoelectric oscillator according to the first embodiment of the present invention.

[Piezoelectric Oscillator of First Embodiment: FIG. 1]

A piezoelectric oscillator according to the first embodiment of the present invention is described with reference to FIG. 1. FIG. 1 is a circuit diagram for the piezoelectric oscillator according to the first embodiment of the present invention.

The piezoelectric oscillator (a first piezoelectric oscillator) according to the first embodiment of the present invention basically includes a transistor 1, a resonant circuit 3, a resistor 4 to be impedance (Z0), a piezoelectric resonator 6 serving as a reflective element, and an output terminal (OUTPUT) 8, as illustrated in FIG. 1.

The transistor 1 is a field effect transistor (FET) 1, and a gate (G) of the FET 1 is connected to one end of the resonant circuit 3, a drain (D) thereof is connected to the output terminal 8, a source (5) thereof is connected to one end of the piezoelectric resonator 6.

The transistor 1 amplifies a resonance frequency output from the resonant circuit 3.

One end of the resonant circuit 3 is connected to the gate (G) of the FET 1, and another end of the resonant circuit 3 is connected to one end of the resistor 4.

The resonant circuit 3 is constituted by an LC resonator, a piezoelectric resonator, a piezoelectric filter, an SAW (Surface Acoustic Wave) resonator, an MEMS (Micro Electro Mechanical Systems) resonator, or the like, and performs oscillation operation of frequency so as to output a resonance frequency to the transistor 1.

Note that a power supply voltage is applied to a side of the output terminal 8 via a resistor.

The piezoelectric resonator 6 serving as a reflective element resonates by use of reflection characteristics, so as to output an oscillation frequency. This oscillation frequency allows an oscillation output to be obtained from the output terminal 8.

Here, the oscillation frequency of the piezoelectric resonator 6 and the resonance frequency of the resonant circuit 3 are set to become substantially the same frequency. This because oscillation start of the piezoelectric resonator 6 can be made earlier by outputting the resonance frequency of the resonant circuit 3 to the piezoelectric resonator 6, thereby resulting in that the frequency can be stabilized at an early stage.

That is, by causing the piezoelectric resonator 6 to resonate as a reflective element, the frequency of the oscillation output obtained from the output terminal 8 can be stabilized at a high frequency at an early stage.

Moreover, the transistor 1 is assumed an FET, but it may be an NPN transistor. In this case, the output terminal 8 is connected to a collector (C), the piezoelectric resonator 6 as a reflective element is connected to an emitter (E), one end of the resonant circuit 3 is connected to a base (B), and another end of the resonant circuit 3 is grounded via the resistor 4.

Note that a filter may be provided so as to be followed by the output terminal 8.

Figure 2:
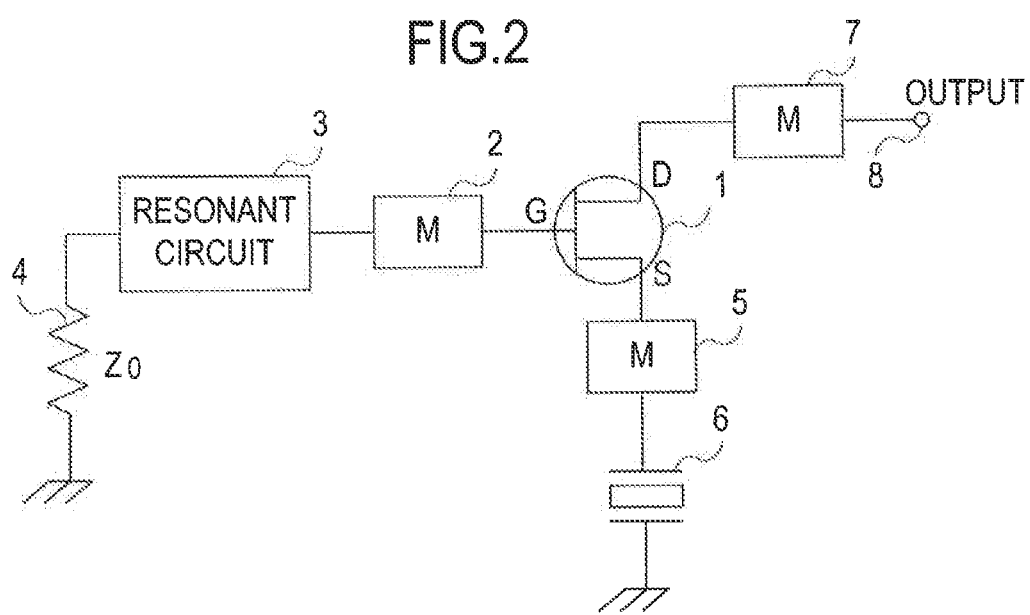
FIG. 2 is a circuit diagram for a piezoelectric oscillator according to the second embodiment of the present invention.

[Piezoelectric Oscillator of Second Embodiment: FIG. 2]

A piezoelectric oscillator according to the second embodiment of the present invention is described with reference to FIG. 2. FIG. 2 is a circuit diagram for the piezoelectric oscillator according to the second embodiment of the present invention.

The piezoelectric oscillator (a second piezoelectric oscillator) according to the second embodiment of the present invention is basically the same as the circuit FIG. 1 as illustrated in FIG. 2. However, a gate (G) of an FET 1 is connected to a resonant circuit 3 via a matching circuit (M) 2, a drain (D) of the FET 1 is connected to an output terminal 8 via a matching circuit (M) 7, a source (S) thereof is connected to one end of a piezoelectric resonator 6 via a matching circuit (M) 5, and another end of the piezoelectric resonator 6 is grounded.

Note that even in the second piezoelectric oscillator, for the purpose of early stabilization of the frequency at a high frequency, the resonance frequency of the resonant circuit 3 and the oscillation frequency of the piezoelectric resonator 6 are set to be substantially the same frequency.

The matching circuits 2, 5, and 7 cause the resonant frequency from the resonant circuit 3 to be variable and adjust the frequency thereof.

That is, although the resonance frequency of the resonant circuit 3 and the oscillation frequency of the piezoelectric resonator 6 are set to be substantially the same frequency, such a case is assumed that a difference between them may be inappropriate. In view of this, the matching circuits 2, 5, and 7 are adjusted so that the resonant frequency of the resonant circuit 3 is variable to be closer to the oscillation frequency of the piezoelectric resonator 5.

More specifically, each of the matching circuits 2, 5, and 7 changes a value(s) of a variable capacitance element or/and a variable resistor provided therein so as to unbalance impedances of the circuit formed on the gate side and the source side. This causes the circuit to be settled down in a balanced state to take a balance, thereby causing the frequency to be variable. A concrete configuration of the matching circuits will be described later.

Note that a power supply voltage is applied to a side of the output terminal 8 via a resistor.

As the transistor 1, an NPN transistor may be used.

Figure 3:
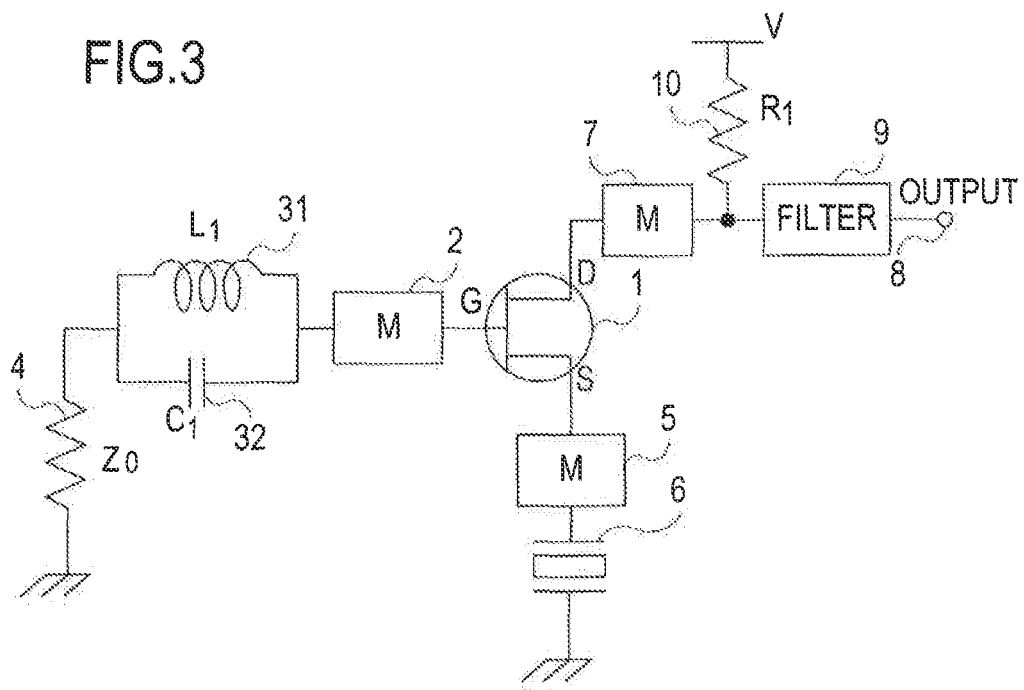
FIG. 3 is a circuit diagram illustrating Example 1 of a specific piezoelectric oscillator in the second embodiment.

[Concrete Example 1 of Second Embodiment: FIG. 3]

Example 1 of a specific piezoelectric oscillator in the second embodiment is described with reference to FIG. 3. FIG. 3 is a circuit diagram illustrating Example 1 of the specific piezoelectric oscillator in the second embodiment.

Example 1 of the specific piezoelectric oscillator (a specific piezoelectric oscillator 1) in the second embodiment is configured as illustrated in FIG. 3 such that: in the second piezoelectric oscillator of FIG. 2, the resonant circuit 3 is a parallel connection circuit of a coil ($L_1$) 31 and a capacitor ($C_1$), a filter 9 is formed between the matching circuit 7 and the output terminal 8, and a power supply voltage V is applied between the matching circuit 7 and the filter 9 via a resistor ($R_1$) 10.

Note that, in the configuration in FIG. 3, the FET 1 may be replaced with an NPN transistor.

Note that even in the specific piezoelectric oscillator 1 of the second embodiment, for the purpose of early stabilization of the frequency at a high frequency, the resonance frequency of the resonant circuit 3 constituted by a parallel circuit of the $L_1$ 31 and the $C_1$ 32 and the oscillation frequency of the piezoelectric resonator 6 are set to be substantially the same frequency.

Figure 4:
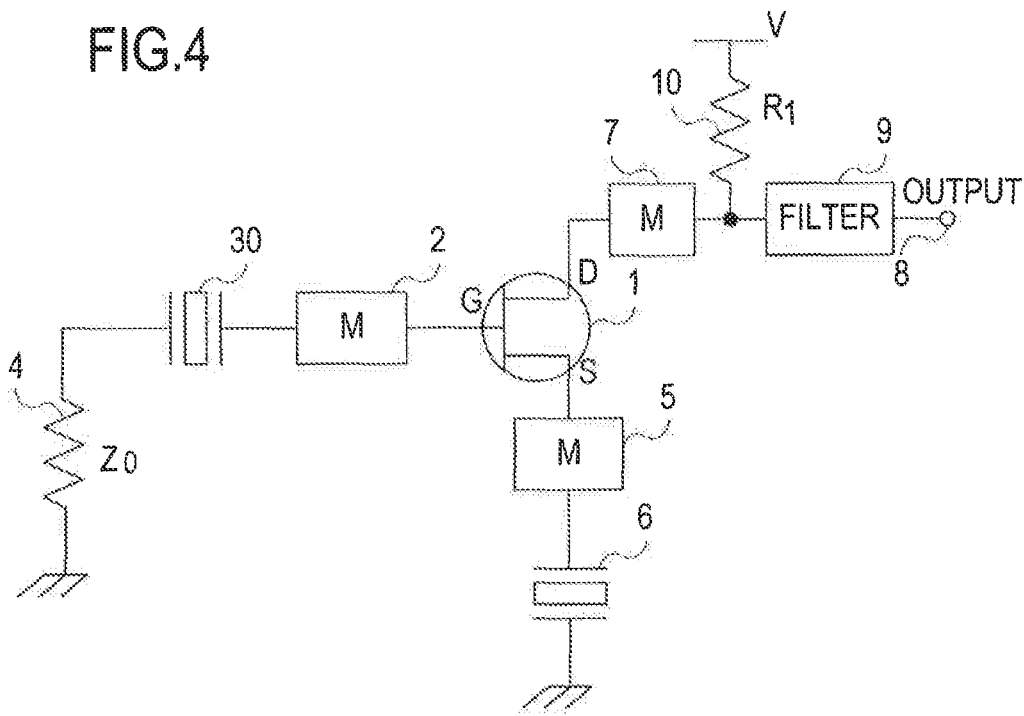
FIG. 4 is a circuit diagram illustrating Example 2 of a specific piezoelectric oscillator in the second embodiment.

[Concrete Example 2 of Second Embodiment: FIG. 4]

Example 2 of the specific piezoelectric oscillator in the second embodiment is described with reference to FIG. 4. FIG. 4 is a circuit diagram illustrating Example 2 of the specific piezoelectric oscillator in the second embodiment.

As illustrated in FIG. 4, Example 2 of the specific piezoelectric oscillator (a specific piezoelectric oscillator 2) in the second embodiment is provided with a piezoelectric resonator 30 instead of the resonant circuit in FIG. 3.

In FIG. 4, the piezoelectric resonator 30 connected to a gate (3) side and the piezoelectric resonator 6 connected to the source (S) have different configurations, and an output frequency is determined by resonance characteristics of the piezoelectric resonator 6 connected to the source (S). That is, the resonance frequency of the piezoelectric resonator 30 and the oscillation frequency of the piezoelectric resonator 6 are set to be substantially the same frequency.

Moreover, in FIG. 4, the piezoelectric resonator 30 and the piezoelectric resonator 6 may be provided not to have different configurations, but configured as resonators such that two electrodes are formed from a single piezoelectric element so that one of them is connected to the gate (3) side and the other one is connected to the source (S) side. Even in this case, the output frequency is determined by resonance characteristics of the piezoelectric resonator provided on the source (S) side.

Note that, in the configuration in FIG. 4, the FET 1 may be replaced with an NPN transistor.

Figure 5:
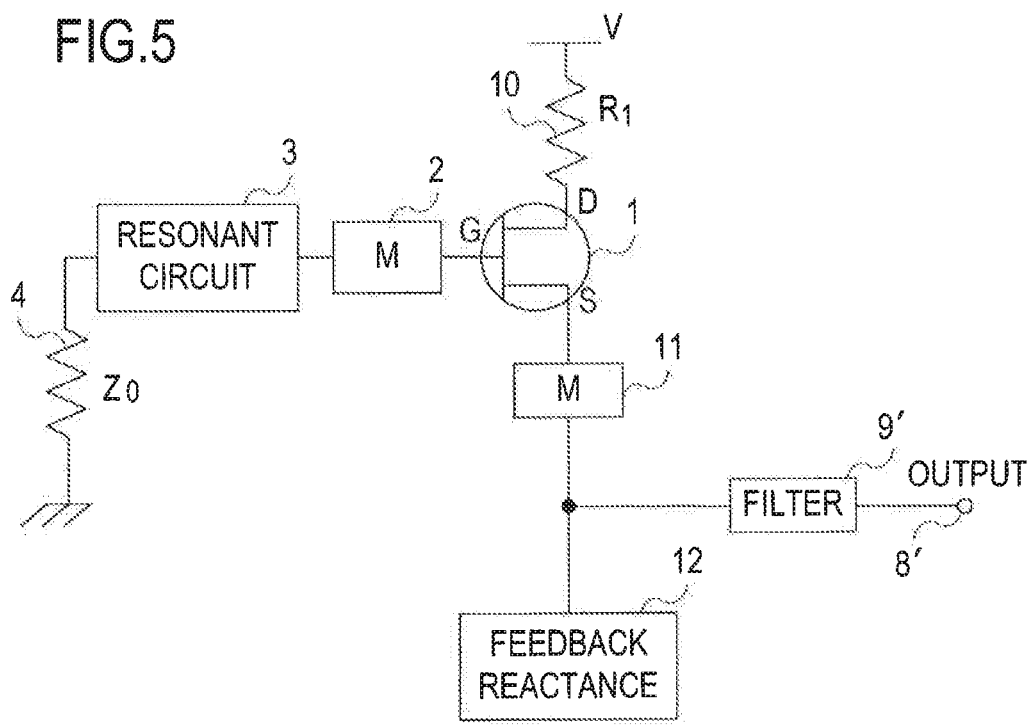
FIG. 5 is a circuit diagram for a piezoelectric oscillator according to the third embodiment of the present invention.

[Piezoelectric Oscillator of Third Embodiment: FIG. 5]

A piezoelectric oscillator according to the third embodiment of the present invention is described with reference to FIG. 5. FIG. 5 is a circuit diagram for the piezoelectric oscillator according to the third embodiment of the present invention.

The piezoelectric oscillator (a third piezoelectric oscillator) according to the third embodiment of the present invention basically includes, as illustrated in FIG. 5, a transistor 1, a matching circuit (M) 2, a resonant circuit 3, a resistor 4 to be impedance ($Z_0$), a feedback reactance 12 serving as a reflective element, a matching circuit (M) 11, an output terminal (OUTPUT) 8', a filter 9', and a resistor (R1) 10.

The transistor 1 is an FET and is configured such that a power supply voltage V is applied to a drain (D) via the resistor 10, the feedback reactance 12 serving as a reflective element is connected to a source (S) via the matching circuit (M) 11, one end of the resonant circuit 3 is connected to a gate (G) via the matching circuit (M) 2, and another end of the resonant circuit 3 is grounded via the resistor 4.

Moreover, the output terminal 8' is provided, via the filter 9', on a line which connects the matching circuit 11 and the feedback reactance 12.

The filter 9' is provided so as to be followed by the output terminal 8'. The filter 9' passes a frequency in a specific bandwidth therethrough, so that the frequency can be output with high accuracy. As the filter, a piezoelectric filter such as a SAW filter may be used The matching circuit 11 causes an oscillation frequency from the feedback reactance 12 to be variable, so as to adjust the frequency thereof.

The feedback reactance 12 works as a reflective element and is a feedback reactance constituted by LCR. A circuit thereof can be realized by IC, so that the feedback reactance 12 can attain high-frequency performance of the oscillator and downsize a product.

Further, a piezoelectric resonator may be used as the feedback reactance 12 such that one end of the piezoelectric resonator is connected to the matching circuit (M) 11, and another end of the piezoelectric resonator is not grounded but open.

The transistor 1, the matching circuit 2, the resonant circuit 3, and the resistor 4 are the same as those described in FIG. 1 or FIG. 2.

In the third piezoelectric oscillator in FIG. 5, the resonance frequency of the resonant circuit 3 and the oscillation frequency in the feedback reactance 12 are also set so as to be substantially the same frequency.

Further, by using different resonance bandwidths in the resonant circuit 3 and the feedback reactance 12, the output frequency can be increased N times or decreased 1/n times.

Further, instead of the FET 1 of FIG. 5, an NPN transistor may be used.

Note that a matching circuit may be provided between the drain (D) of the transistor 1 and the resistor 10.

Figure 6:
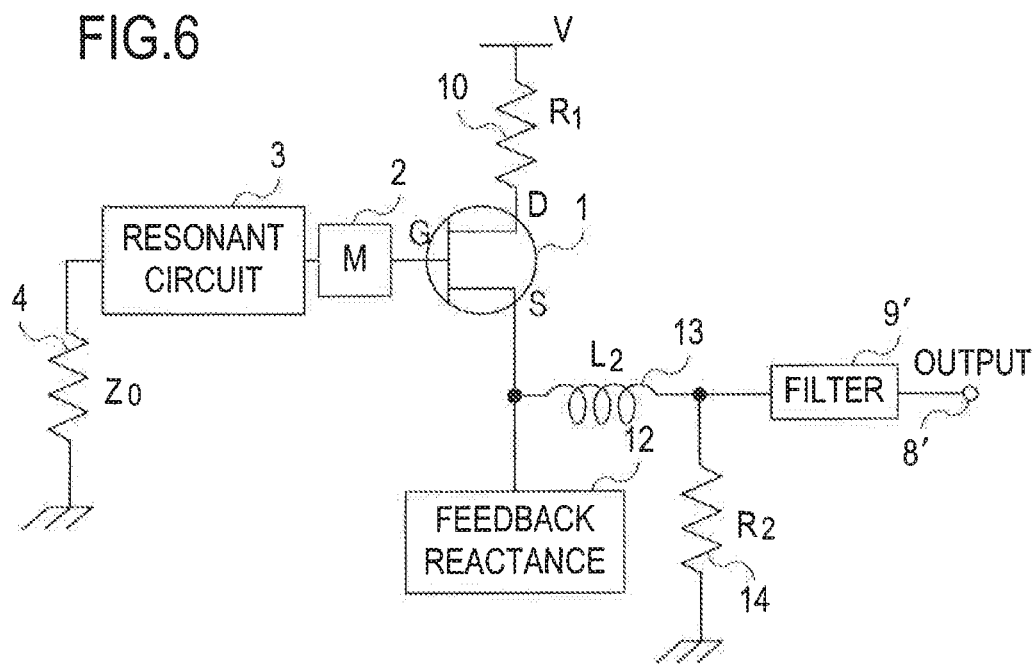
FIG. 6 is a circuit diagram for a piezoelectric oscillator according to the fourth embodiment of the present invention.

[Piezoelectric Oscillator of Fourth Embodiment: FIG. 6]

A piezoelectric oscillator according to the fourth embodiment of the present invention is described with reference to FIG. 6. FIG. 6 is a circuit diagram for the piezoelectric oscillator according to the fourth embodiment of the present invention.

The piezoelectric oscillator (a fourth piezoelectric oscillator) according to the fourth embodiment of the present invention is configured as illustrated in FIG. 6 such that: one end of a coil ($L_2$) 13 is connected to a source (S) instead of the matching circuit 11 of FIG. 5, and another end thereof is connected to an input of a filter 9'; and one end of a resistor ($R_2$) 14 is connected to a node between the another end of the coil 13 and the input side of the filter 9', and another end thereof is grounded.

In the fourth piezoelectric oscillator in FIG. 6, the resonance frequency of the resonant circuit 3 and the oscillation frequency in the feedback reactance 12 are also set so as to be substantially the same frequency.

Thus, even with the circuit using the L13 and the R14 in FIG. 6, instead of the matching circuit 11 in FIG. 5, an effect similar to that of FIG. 5 can be achieved. That is, an unbalanced state is created by adjusting the matching circuit 2 so that the frequency is made variable by use of returning to a balanced state, thereby stabilizing the frequency.

Note that an NPN transistor may be used instead of the FET 1 of FIG. 6.

Further, a matching circuit may be provided between the drain (D) of the transistor 1 and the resistor 10.

Figure 7:
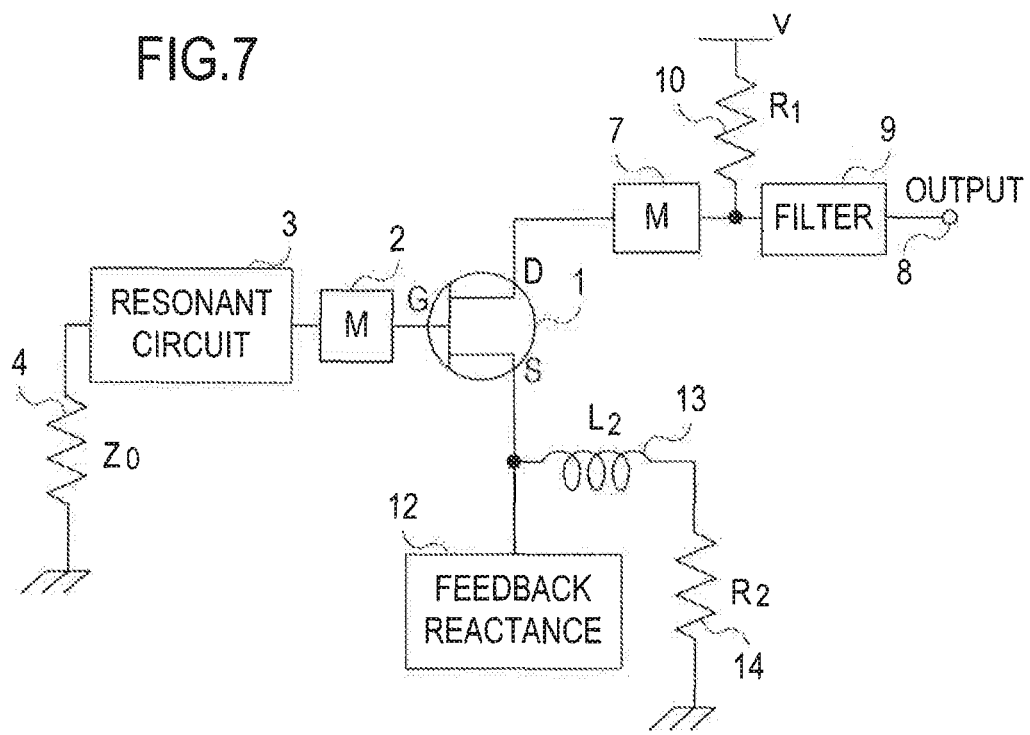
FIG. 7 is a circuit diagram for a piezoelectric oscillator according to the fifth embodiment of the present invention.

[Piezoelectric Oscillator of Fifth Embodiment: FIG. 7]

A piezoelectric oscillator according to the fifth embodiment of the present invention is described with reference to FIG. 7. FIG. 7 is a circuit diagram for the piezoelectric oscillator according to the fifth embodiment of the present invention.

The piezoelectric oscillator (a fifth piezoelectric oscillator) according to the fifth embodiment of the present invention is configured as illustrated in FIG. 7 such that the filter 9 and the output terminal 8' in FIG. 6 are removed; an output terminal 8 is connected to a drain (D) of a transistor I via a matching circuit 7 and a filter 9; and a power supply voltage V is applied to a node between the matching circuit 7 and the filter 9 via a resistor ($R_1$) 10.

In the fifth piezoelectric oscillator in FIG. 7, the resonance frequency of a resonant circuit 3 and the oscillation frequency in a feedback reactance 12 are also set so as to be substantially the same frequency.

Even with the circuit in FIG. 7, an effect similar to those in FIG. 5 and FIG. 6 can be achieved. That is, an unbalanced state is created by adjusting the matching circuits 2 and 7 so that the frequency is made variable by use of returning to a balanced state, thereby stabilizing the frequency.

Note that an NPN transistor may be used instead of the FET 1 in FIG. 7.

Figure 8:
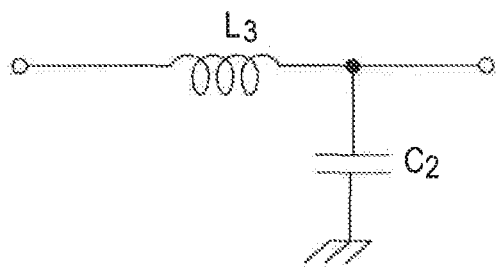
FIG. 8 is a circuit diagram for a matching circuit 1.

[Matching Circuit 1: FIG. 8]

Next will be explained Example 1 (a matching circuit 1) of the matching circuit in the present embodiments, with reference to FIG. 8. FIG. 8 is a circuit diagram for the matching circuit 1.

As illustrated in FIG. 8, the matching circuit 1 is constituted by a variable coil $L_3$ and a variable capacitor $C_2$, and configured such that one end of the variable capacitor C2 is connected to an output side of a variable coil L3 and another end thereof is grounded.

In the matching circuit 1, an unbalanced state is created by changing one or both of values of the variable coil $L_3$ and the variable capacitor $C_2$, so that the frequency is made variable by use of returning to a balanced state.

Figure 9:
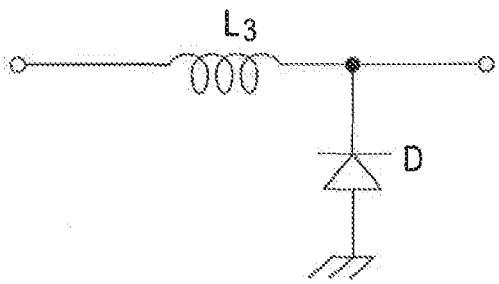
FIG. 9 is a circuit diagram for a matching circuit 2.

[Matching Circuit 2: FIG. 9]

Next will be explained Example 2 (a matching circuit 2) of the matching circuit in the present embodiments, with reference to FIG. 9, FIG. 9 is a circuit diagram for the matching circuit 2.

As illustrated in FIG. 9, the matching circuit 2 is configured such that: a variable diode D is used instead of the capacitor $C_2$ in FIG. 8; a cathode side of the variable diode D is connected to an output side of a coil $L_3$; and an anode side of the variable diode ID is grounded.

In the matching circuit 2, an unbalanced state created by changing one or both of values of the variable coil $L_3$ and the variable diode ID, so that the frequency is made variable by use of returning to a balanced state.

As the matching circuits in FIGS. 1 to 7, the matching circuit 1 or 2 is used

Figure 10:
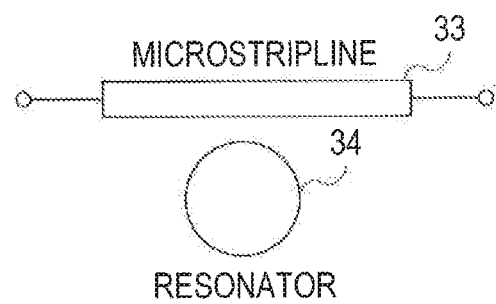
FIG. 10 is a circuit diagram illustrating a case where a resonant circuit is a microwave circuit.

[Resonant Circuit (Microwave Circuit): FIG. 10]

Next will be explained a case where the resonant circuit in the present embodiments is a microwave circuit, with reference to FIG. 10, FIG. 10 is a circuit diagram illustrating a case where the resonant circuit is a microwave circuit.

In a case where the resonant circuit is a microwave circuit, the resonant circuit is constituted by a microstripline 33 and a resonator 34, and configured such that the resonator 34 is provided beside the microstripline 33 in a non-contact manner.

In the case of the microwave circuit, the resonant circuit in FIG. 10 is used as the resonant circuit in FIGS. 1, 2, and 5 to 7.

Figure 11:
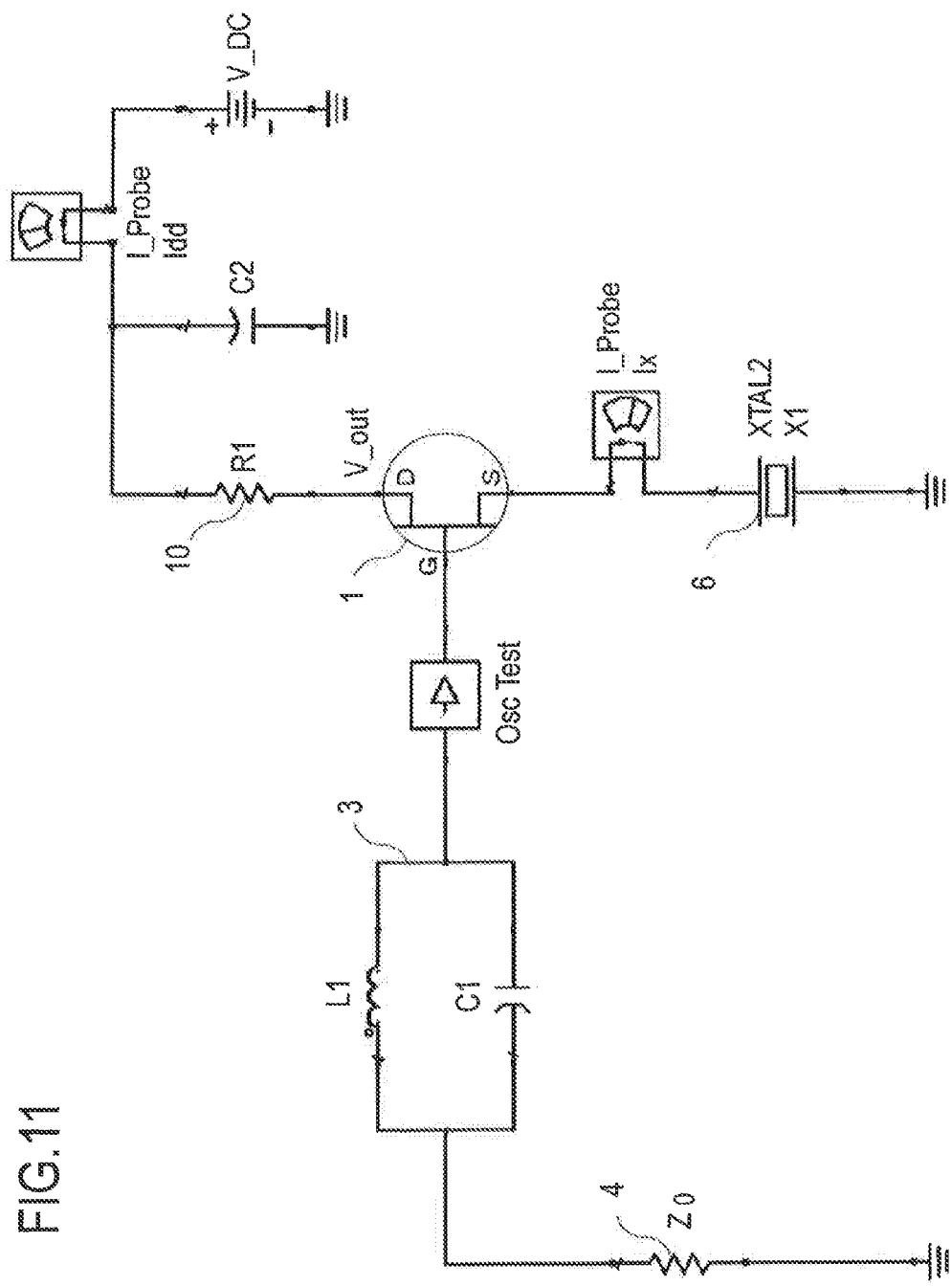
FIG. 11 is a circuit diagram for a simulation circuit.

[Simulation Circuit: FIG. 11]

The following describes operation verification by performing simulation for the present embodiments.

First of all, a simulation circuit is based on a circuit in FIG. 1, and the resonant circuit 3 is a parallel circuit of a coil and a capacitor, as illustrated in FIG. 11. FIG. 11 is a circuit diagram for the simulation circuit.

As illustrated in FIG. 11, the simulation circuit is configured such that a gate (G) of an FET 1 is connected to one end of a resonant circuit 3 of LC, and another end of the resonant circuit 3 is grounded via a resistor ($Z_0$).

The resonant circuit 3 is a parallel connection circuit of a coil L1 and a capacitor C1.

A source (S) of the FET 1 is connected to one end of a piezoelectric resonator 6, and another end of the piezoelectric resonator 6 is grounded. Note that an ammeter is provided on a source (S) side of the FET 1.

Further, a drain (D) of the FET 1 is connected to an output terminal (Vout) 8 and to one end of a resistor (R1) 10 and another end of the resistor 10 is connected to a power supply voltage (V_DC). Note that an ammeter is provided for the another end of the resistor 10, and further, one end of a capacitor (C2) for noise rejection is connected to the another end of the resistor 10, and another end of the capacitor is grounded.

Here, a resonance frequency f3 of the resonant circuit 3 is found by the following formula:

$$f3 = \frac{1}{2}\pi \sqrt{(L1C1)}.$$

Further, values of the L1 and the C1 are determined so that f5=f3 is satisfied where f5 is assumed an oscillation frequency of the piezoelectric resonator 6. This allows the resonance frequency f3 of the resonant circuit 3 to be substantially equal to the oscillation frequency f5 of the piezoelectric resonator 6, thereby resulting in that frequency stabilization can be realized at a high frequency at an early stage.

Figure 12:
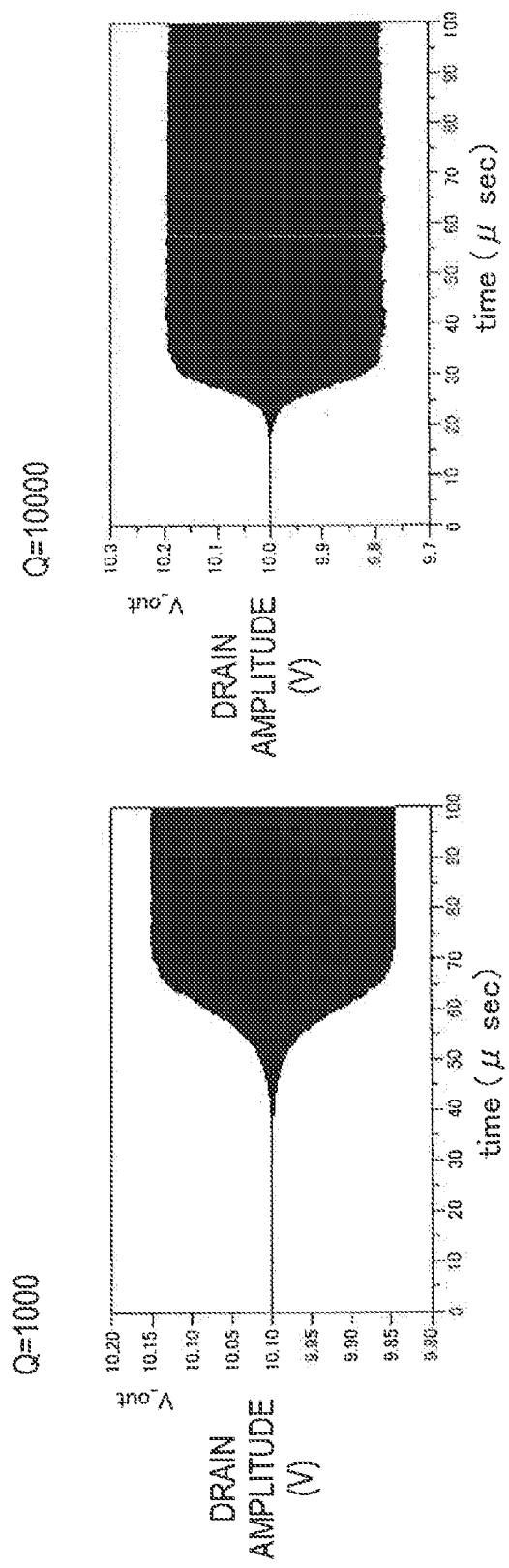
FIG. 12 is views showing simulation results of oscillation starting time
Figure 13:
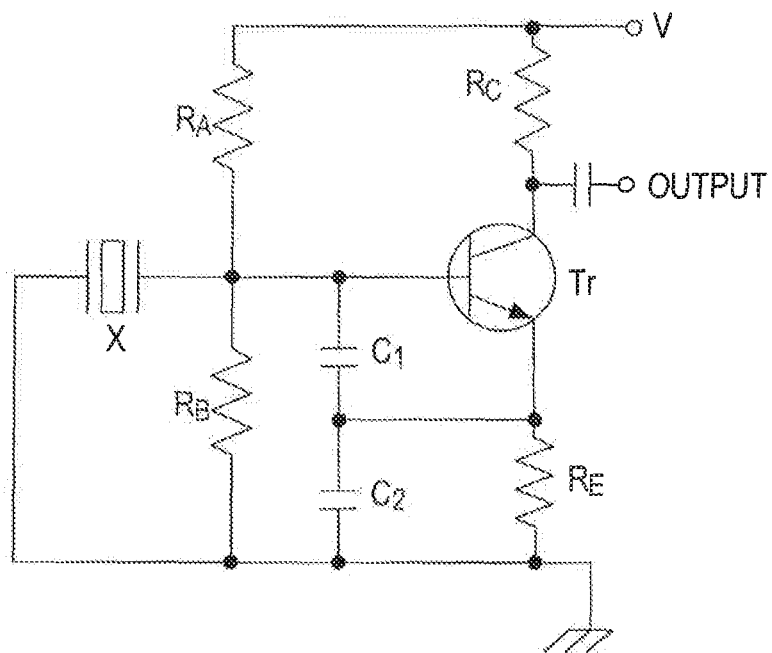
FIG. 13 is a circuit diagram for a conventional Colpitis crystal oscillator.
Figure 14:
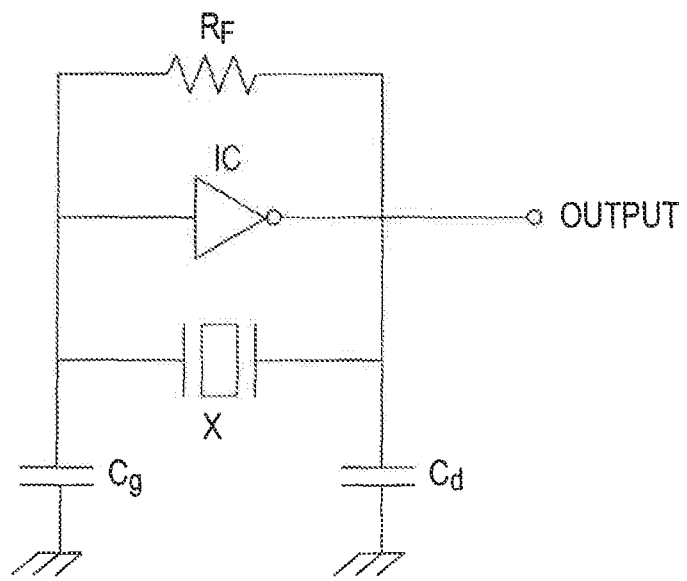
FIG. 14 is a circuit diagram for a conventional inverter crystal oscillation circuit.

[Simulation Result: FIG. 12]

The following describes simulation results with reference to FIG. 12. FIG. 12 is views showing simulation results of oscillation starting time. Note that, in FIG. 12, a transverse axis indicates time (time [μsec]), and a vertical axis indicates amplitude (drain amplitude) of a voltage (V_out) of the drain.

FIG. 12 shows a change in starting time of an output voltage [V] in respective cases of Q=1000 and Q=10000 where Q is crystal of the piezoelectric resonator 6.

In the case of crystal Q=10000, the oscillation starting time attained 30 μs. Further, in the case of crystal Q=1000, the oscillation starting time attained 50 μs. From the viewpoint that the starting time of a conventional crystal oscillator is about 300 μs, the present embodiments can remarkably shorten the starting time even in a state where crystal Q is low.

Further, in the simulation circuit in FIG. 11, a current IX flowing into the piezoelectric resonator 6 was 0.045 mA, which is very small as compared with the conventional technique in which a current a few mA.

This is because in the piezoelectric oscillator according to the present embodiments, a resistance component of the piezoelectric resonator 6 is small, and the piezoelectric resonator 6 functions as a capacitance component.

Conventionally, in a crystal oscillator used as a resonator, a resistance component fluctuates due to temperature change/ temporal change. In view of this, a stability region has been examined conventionally by changing a parameter at the time of designing.

In contrast, in the present embodiments, the resistance component of the piezoelectric resonator 6 is made small, thereby making it possible to realize stable operation that does not depend on the fluctuation of the resistance component.

[Measure for Activity Dip]

When a crystal oscillator is used while current flows therein, frequency jump called activity dip occurs, which may cause troubles.

In order to avoid this frequency jump, it is necessary to decrease the current flowing into the crystal oscillator to 0.3 mA or less, but the decrease in current is difficult in the conventional circuit. Patent Document 5 discloses an oscillator circuit in which driving current supplied to a piezoelectric vibrator is 0.3 mA or less, but it was difficult to decrease the current flowing into the piezoelectric resonator 6 used as a reflective element to 0.3 mA or less.

In the present simulation circuit, the current IX flowing into the piezoelectric resonator 6 is 0.04 mA to 0.05 mA, and thus, a current of 0.3 mA or less can be realized, thereby making it possible to use the simulation cult in a state where no frequency jump occurs.

[Effects of Embodiments]

A piezoelectric oscillator according to an embodiment of the present invention is configured such that: a resonant circuit 3 is connected to a gate of a transistor 1; an output terminal 8 is connected to a drain; a power supply voltage V is applied to a side of the output terminal 8; a reflective element is connected to a source; and a resonance frequency of the resonant circuit 3 and an oscillation frequency of the reflective element are set to substantially the same frequency. Accordingly, the piezoelectric oscillator has an effect to stabilize its frequency at a high frequency at an early stage.

A piezoelectric oscillator according to an embodiment of the present invention is configured such that: a matching circuit 2 is connected between a gate of a transistor 1 and a resonant circuit 3; a matching circuit 5 is connected between a source of the transistor 1 and a reflective element 6; a matching circuit 7 is connected between a drain and an output terminal 8; and a resonant frequency of the resonant circuit 3 is made variable by adjusting the matching circuits 2, 5, and 7 so as to be closer to the oscillation frequency of the reflective element. Accordingly, the piezoelectric oscillator has an effect to stabilize its frequency at a high frequency.

Further, a piezoelectric oscillator according to an embodiment of the present invention is configured such that a matching circuit 2 is connected between a gate of a transistor 1 and a resonant circuit 3; a power supply voltage V is applied to a drain; and a reflective element and an output terminal are connected to a source via a matching circuit 11, and thus, the piezoelectric oscillator has an effect to stabilize its frequency at a high frequency.

Further, a piezoelectric oscillator according to an embodiment of the present invention is configured such that: a variable capacitance element or/and a variable resistance or the like in a matching circuit are made variable, so that unbalance between impedances on a gate side and a source side is created to make an oscillation frequency variable, thereby making it advantageously possible to stabilize the frequency thus made variable by settling down to a balanced state.

The present invention is suitable for a piezoelectric oscillator which can achieve high-frequency performance and frequency stabilization with the use of reflection characteristics of a reflective element.

What is claimed is:

1. A piezoelectric oscillator comprising a transistor, wherein:
   one end of a resonant circuit is connected to a gate of the transistor;
   another end of the resonant circuit is grounded via a resistor;
   an output terminal is provided for a drain of the transistor;
   a piezoelectric resonator for causing reflection by resonance is connected to a source of the transistor;
   the piezoelectric resonator serving as a reflective element resonates by use of reflection characteristics and output an oscillation frequency; and
   the oscillation frequency of the piezoelectric resonator and a resonance frequency of the resonant circuit are set to substantially the same frequency.

2. The piezoelectric oscillator according to claim 1, wherein the resonant circuit is constituted by a parallel connection circuit of a coil and a capacitor.

3. The piezoelectric oscillator according to claim 1, wherein the resonant circuit is a piezoelectric resonator.

4. The piezoelectric oscillator according to claim 1, wherein a filter is provided so as to be followed by the output terminal.

5. A piezoelectric oscillator comprising a transistor, wherein:
   a resonant circuit is connected to a gate of the transistor via a first matching circuit;
   an output terminal is provided for a drain of the transistor via a second matching;
   a piezoelectric resonator for causing reflection by resonance is connected to a source of the transistor via a third matching circuit; and
   a resonance frequency of the resonant circuit is made variable by the first matching circuit, the second matching circuit, and the third matching circuit, thereby setting the resonance frequency thus made variable and an oscillation frequency of the piezoelectric resonator to substantially the same frequency.

6. The piezoelectric oscillator according to claim 5, wherein the resonant circuit is constituted by a parallel connection circuit of a coil and a capacitor.

7. The piezoelectric oscillator according to claim 5, wherein the resonant circuit is a piezoelectric resonator.

8. The piezoelectric oscillator according to claim 5, wherein a filter is provided so as to be followed by the output terminal.

* * * * *